(12) United States Patent
Yoshida et al.

(10) Patent No.: US 11,837,485 B2
(45) Date of Patent: Dec. 5, 2023

(54) SUBSTRATE HOLDING HAND AND SUBSTRATE CONVEYING APPARATUS

(71) Applicant: KAWASAKI JUKOGYO KABUSHIKI KAISHA, Kobe (JP)

(72) Inventors: Tetsuya Yoshida, Kakogawa (JP); Ryosuke Kanamaru, Kakogawa (JP); Shinya Kinoshita, Kobe (JP); Takayuki Fukushima, Takarazuka (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 682 days.

(21) Appl. No.: 16/482,526

(22) PCT Filed: Jan. 29, 2018

(86) PCT No.: PCT/JP2018/002766
§ 371 (c)(1),
(2) Date: Jul. 31, 2019

(87) PCT Pub. No.: WO2018/143130
PCT Pub. Date: Aug. 9, 2018

(65) Prior Publication Data
US 2020/0335372 A1    Oct. 22, 2020

(30) Foreign Application Priority Data

Jan. 31, 2017  (JP) .............................. JP2017-015633

(51) Int. Cl.
*H01L 21/677*    (2006.01)
*B25J 15/00*    (2006.01)
(Continued)

(52) U.S. Cl.
CPC .... *H01L 21/67712* (2013.01); *B25J 15/0009* (2013.01); *B65G 49/07* (2013.01); *H01L 21/67718* (2013.01); *H01L 21/68707* (2013.01)

(58) Field of Classification Search
CPC ......... H01L 21/67712; H01L 21/67718; H01L 21/68707; B25J 15/0009; B65G 49/07
See application file for complete search history.

(56) References Cited

U.S. PATENT DOCUMENTS 6,062,241 A     5/2000  Tateyama et al.
6,435,807 B1 *  8/2002  Todorov ............ H01L 21/68707
                                        414/757
(Continued)

FOREIGN PATENT DOCUMENTS

CN      101396831 A      4/2009
JP      10209243 A  *   8/1998
(Continued)

*Primary Examiner* — Gerald McClain
(74) *Attorney, Agent, or Firm* — Oliff PLC (57) ABSTRACT

Substrate holding hand including a base plate spreading from base toward tip end sides, part of base plate located at base end side, fixed to hand tip portion, holding position at base plate, engaging claw at part of base plate located at tip end side, engaging claw configured to engage part of edge of substrate in vertical or inclined postures, part of edge located lower than center of substrate, moving portion at base end side of holding position and configured to move toward tip end side, and plurality of rotating bodies at the moving portion, being pressed by movement against edge of substrate located lower than holding position and engaged with claw, and plurality of rotating bodies pushing substrate upward holding position while rotating along edge of substrate.

4 Claims, 10 Drawing Sheets

(51) Int. Cl.
*B65G 49/07* (2006.01)
*H01L 21/687* (2006.01)

(56) References Cited

U.S. PATENT DOCUMENTS

| | | | | |
|---|---|---|---|---|
| 7,140,655 | B2 * | 11/2006 | Kesil | B25J 9/1633 414/941 |
| 7,374,393 | B2 * | 5/2008 | Rice | H01L 21/67178 414/744.5 |
| 7,694,688 | B2 * | 4/2010 | Lester | H01L 21/67766 134/140 |
| 11,518,038 | B2 * | 12/2022 | Sugahara | B25J 9/1697 |
| 2009/0084215 | A1 * | 4/2009 | Yazawa | B25J 15/028 294/116 |
| 2013/0341946 | A1 * | 12/2013 | Yamanaka | B25J 15/008 294/213 |
| 2019/0393070 | A1 * | 12/2019 | Bosboom | H01L 21/67265 |
| 2021/0050244 | A1 * | 2/2021 | Kakinuma | B25J 15/0014 |

FOREIGN PATENT DOCUMENTS

| | | | | |
|---|---|---|---|---|
| JP | H10-316242 | A | | 12/1998 |
| JP | 2000260858 | A * | | 9/2000 |
| JP | 2002-141405 | A | | 5/2002 |
| JP | 2002141405 | A * | | 5/2002 |
| JP | 2002170862 | A * | | 6/2002 |
| JP | 2004063668 | A * | | 2/2004 |
| JP | 2004281475 | A * | 10/2004 | ....... H01L 21/67712 |
| JP | 2010179420 | A * | | 8/2010 |
| JP | 2015079820 | A * | | 4/2015 |

* cited by examiner

Fig.13 ent invention relates to a substrate holding hand
SUBSTRATE HOLDING HAND AND SUBSTRATE CONVEYING APPARATUS

TECHNICAL FIELD

The present invention relates to a substrate holding hand configured to hold an edge portion of a substrate having a circular plate shape, and a substrate conveying apparatus including the substrate holding hand.

BACKGROUND ART

Conventionally known is a substrate conveying apparatus including: a hand configured to hold an edge portion of a semiconductor substrate that is a material of a substrate of a semiconductor device; and a manipulator to which the hand is attached. As this type of substrate conveying apparatus, for example, PTL 1 proposes a substrate conveying apparatus configured to convey a substrate placed in a vertical posture. Herein, the "vertical posture" denotes such a posture that a main surface of the substrate faces in a horizontal direction (i.e., the main surface of the substrate extends in a vertical direction).

PTL 1 describes the substrate conveying apparatus including a chuck hand capable of taking out and supplying the substrate in the vertical posture and taking out and supplying the substrate in a horizontal posture. The chuck hand includes a flat plate member, two fixed engaging members, a movable engaging member, and an auxiliary engaging member. The two fixed engaging members can be engaged with an edge of the substrate.

When the chuck hand configured as above takes out the substrate in the vertical posture from a groove at which the substrate is placed, first, the posture of the chuck hand is controlled such that the movable engaging member is located under the substrate, and the chuck hand is moved to a position corresponding to the substrate. The two fixed engaging members and the substrate are engaged with each other, and in this state, the auxiliary engaging member is moved forward to be engaged with the substrate. With this, the auxiliary engaging member and the fixed engaging members auxiliary hold the substrate. After that, by moving the movable engaging member forward, the substrate is moved to a holding position, and the movable engaging member and the fixed engaging members hold the substrate.

CITATION LIST

Patent Literature

PTL 1: Japanese Laid-Open Patent Application Publication No. 2002-141405

SUMMARY OF INVENTION

Technical Problem

According to the above-described substrate conveying apparatus, by moving the movable engaging member forward toward the substrate in the vertical posture or an inclined posture, the substrate is pushed into groove deep portions of the two fixed engaging members to be held. However, the substrate may not reach the groove deep portions of the two fixed engaging members at the same time. To be specific, the substrate may first reach one of the groove deep portions of the two fixed engaging members depending on the position of the substrate pushed by the movable engaging member. In such a case, by further moving the movable engaging member forward, the substrate is moved to the holding position. However, if friction is large at a contact portion between the substrate and the fixed engaging member or a contact portion between the movable engaging member and the substrate, the substrate may not be smoothly moved to the holding position, and unnecessary stress may be generated at the substrate.

An object of the present invention is to provide a substrate holding hand and a substrate conveying apparatus, each of which is capable of, when the substrate holding hand holds a substrate having a circular plate shape and placed in a vertical posture or an inclined posture, reducing frictional force generated between the substrate holding hand and the substrate.

Solution to Problem

A substrate holding hand according to one aspect of the present invention is a substrate holding hand attached to a hand tip portion of a manipulator and configured to hold a substrate having a circular plate shape and placed in a vertical posture or an inclined posture. The substrate holding hand includes: a base plate spreading from a base end side toward a tip end side, part of the base plate which part is located at the base end side being fixed to the hand tip portion, a holding position being defined at the base plate; an engaging claw provided at part of the base plate which part is located at the tip end side, the engaging claw being configured to be engaged with part of an edge of the substrate in the vertical posture or the inclined posture, the part of the edge being located lower than a center of the substrate; a moving portion provided at the base end side of the holding position and configured to move toward the tip end side; and a plurality of rotating bodies provided at part of the moving portion which part is located at the tip end side, the plurality of rotating bodies being pressed by the movement of the moving portion against the edge of the substrate located lower than the holding position and engaged with the engaging claw, and with this, the plurality of rotating bodies pushing the substrate upward toward the holding position while rotating along the edge of the substrate.

A substrate conveying apparatus according to another aspect of the present invention includes: the above substrate holding hand; and a manipulator including a hand tip portion to which the substrate holding hand is attached.

According to the above configuration, when holding the substrate having the circular plate shape and placed in the vertical posture or the inclined posture, the rotating bodies configured to push from the base end side the substrate located lower than the holding position and engaged with the engaging claw pushes the substrate upward toward the holding position while rotating along the edge of the substrate. Therefore, the frictional force generated at the contact portion where the substrate holding hand and the substrate contact each other when the substrate is moved to the holding position can be reduced. With this, the substrate can be smoothly moved to the holding position, and unnecessary stress can be prevented from being generated at the substrate.

Advantageous Effects of Invention

The present invention can provide a substrate holding hand and a substrate conveying apparatus, each of which is capable of, when the substrate holding hand holds a substrate having a circular plate shape and placed in a vertical posture, reducing frictional force generated between the substrate holding hand and the substrate.

DESCRIPTION OF EMBODIMENTS

Figure 1:
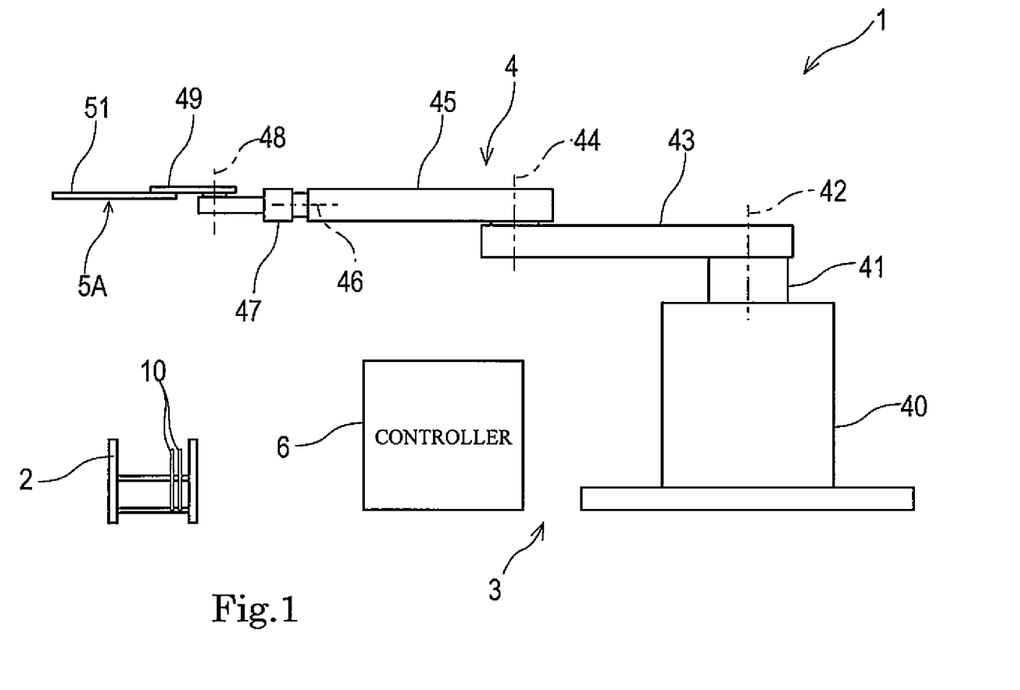
FIG. 1 is a schematic configuration diagram of a substrate conveying system according to an embodiment.
Figure 2:
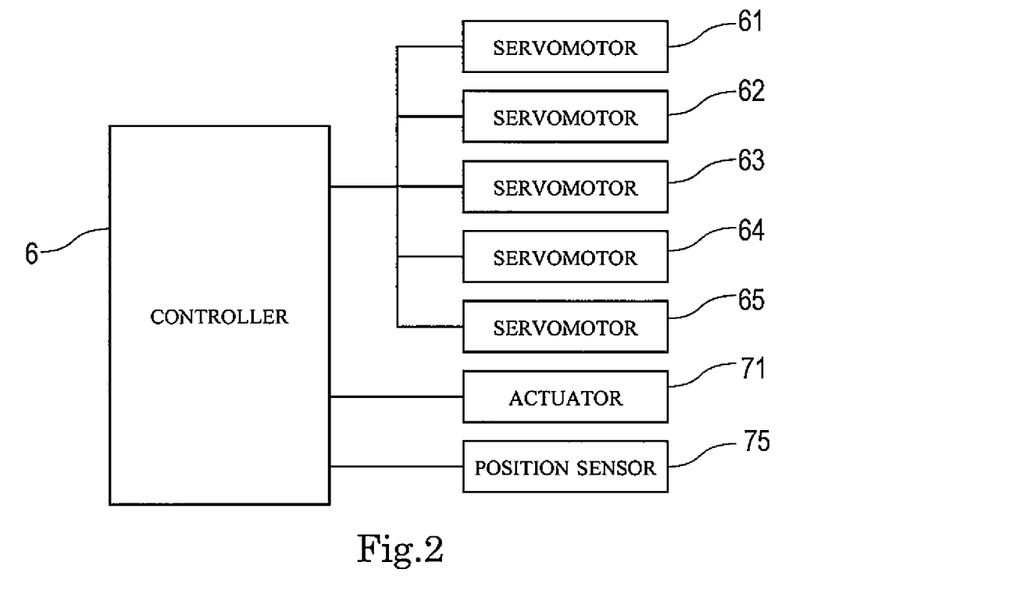
FIG. 2 is a block diagram showing a control configuration of the substrate conveying system.

Next, an embodiment of the present invention will be described with reference to the drawings. FIG. 1 is a diagram showing a schematic configuration of a substrate conveying system 1 according to an embodiment of the present invention, and FIG. 2 is a block diagram showing a control configuration of the substrate conveying system 1. The substrate conveying system 1 according to the present embodiment includes a substrate vertically placing container 2 and a substrate conveying apparatus 3. The substrate vertically placing container 2 supports substrates 10 each having a circular plate shape and placed in a vertical posture (i.e., such a posture that a main surface of the substrate extends in a vertical direction). The substrate conveying apparatus 3 takes out the substrate 10 accommodated in the substrate vertically placing container 2 in the vertical posture. The substrate conveying apparatus 3 transfers the substrate 10 to, for example, a container or a device at which the substrate 10 can be placed horizontally. It should be noted that the substrate vertically placing container 2 may support the substrates 10 each having a circular plate shape and placed in a posture (inclined posture) inclined relative to the vertical direction instead of the vertical posture, and the substrate conveying apparatus 3 may take out the substrate 10 accommodated in the substrate vertically placing container 2 in the inclined posture.

Substrate Vertically Placing Container 2

Figure 3A:
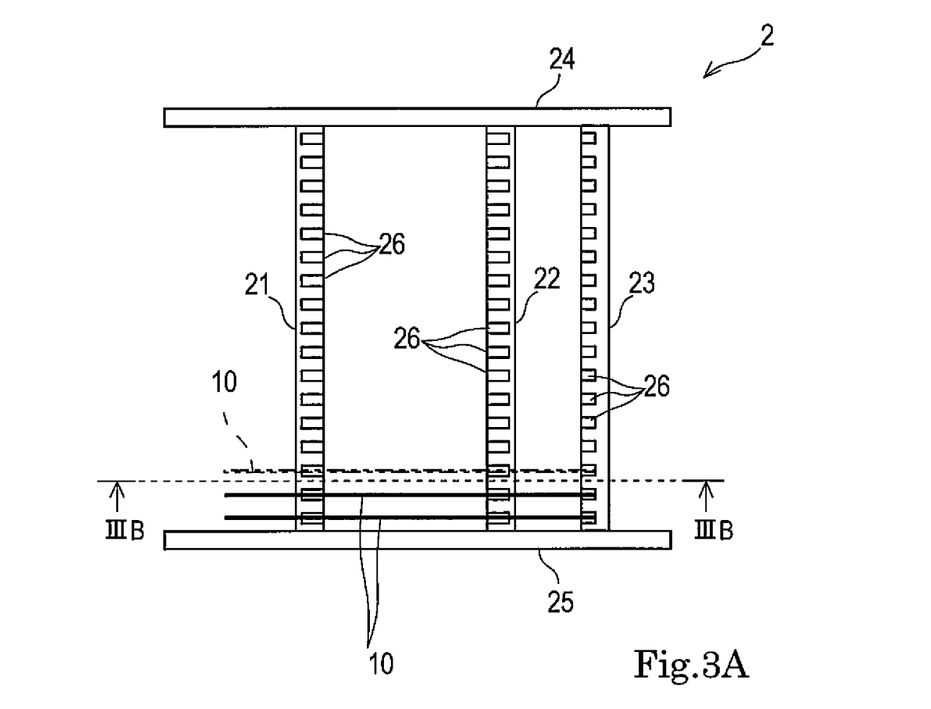
FIG. 3A is a plan view showing one example of a substrate vertically placing container.
Figure 3B:
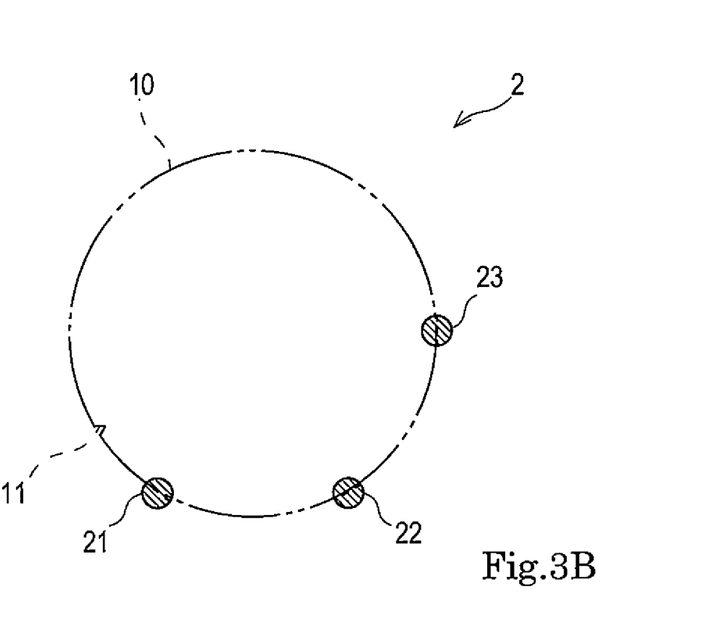
FIG. 3B is a sectional view taken along line IIIB-IIIB of FIG. 3A.

FIGS. 3A and 3B are diagrams showing one example of the substrate vertically placing container 2. FIG. 3A is a plan view of the substrate vertically placing container 2, and FIG. 3B is a sectional view taken along line IIIB-IIIB of FIG. 3A.

As shown in FIG. 3A, the substrate vertically placing container 2 of the present embodiment is a boat configured to support a plurality of substrates 10 in the vertical posture and convey or store the substrates 10 as a group. It should be noted that the substrate vertically placing container 2 does not have to be the boat and may be a container capable of supporting the substrates 10 in the vertical posture. The substrate vertically placing container 2 includes three supporting members 21 to 23 and two coupling members 24 and 25. The supporting members 21 to 23 are parallel to each other and extend in a horizontal direction. The coupling members 24 and 25 each has a flat plate shape and are coupled to end portions of the supporting members 21 to 23. As shown in FIG. 3B, regarding the three supporting members 21 to 23, the supporting members 21 and 22 are provided at the same height and away from each other in the horizontal direction, and the supporting member 23 is provided above the supporting members 21 and 22.

Each of the supporting members 21 to 23 includes a plurality of placing grooves 26 at which the substrates 10 are placed. The placing grooves 26 are formed at substantially regular intervals (for example, 5 to 15 mm) along a direction in which the supporting members 21 to 23 extend. A vertically placing rack configured to hold the substrates 10 in the vertical posture is formed by the placing grooves 26. The supporting members 21 and 22 support lower parts of an edge of the substrate 10 placed in the vertical posture, and the supporting member 23 supports a side part of the edge of the substrate 10 placed in the vertical posture.

In the present invention, the substrate 10 is a circular thin plate that is a material of a substrate of a semiconductor device, such as a semiconductor substrate or a glass substrate. Examples of the semiconductor substrate include a silicon substrate, a sapphire (monocrystal alumina) substrate, and other various substrates. Examples of the glass substrate include a FPD (Flat Panel Display) glass substrate and a MEMS (Micro Electro Mechanical Systems) glass substrate.

In FIG. 3B, the substrate 10 placed at the substrate vertically placing container 2 is shown by a two-dot chain line. In the present embodiment, as shown in FIG. 3B, a notch 11 is formed at part of a peripheral edge of the substrate 10. The notch 11 is a cutout indicating the direction of the substrate 10.

Substrate Conveying Apparatus 3

As shown in FIGS. 1 and 2, the substrate conveying apparatus 3 includes a manipulator 4, a substrate holding hand 5A, and a controller 6. The substrate holding hand 5A is an end effector attached to a hand tip portion of the manipulator 4, and the controller 6 controls operations of the substrate conveying apparatus 3. Hereinafter, components of the substrate conveying apparatus 3 will be described.

Manipulator 4

The manipulator 4 of the substrate conveying apparatus 3 according to the present embodiment is a horizontally articulated robot including a turnable wrist 47. It should be noted that the manipulator 4 is not limited to the horizontally articulated robot and may be configured based on a vertically articulated robot.

The manipulator 4 includes: a base 40; a lifting shaft 41 configured to expand and contract from the base 40 in an upper-lower direction; a first link 43 coupled to the lifting shaft 41 so as to be turnable around a first axis 42 passing through a center axis of the lifting shaft 41; a second link 45 coupled to a tip end of the first link 43 so as to be turnable around a second axis 44; the wrist 47 coupled to a tip end of the second link 45 so as to be turnable around a third axis 46; and a hand base portion 49 coupled to a tip end of the wrist 47 so as to be turnable around a fourth axis 48. The substrate holding hand 5A is attached to the hand base portion 49. The first axis 42 and the second axis 44 are vertical axes, and the third axis 46 is a horizontal axis. The fourth axis 48 is perpendicular to the third axis 46, and a regular posture thereof is a vertical posture.

As driving portions configured to rotate the first link 43, the second link 45, the wrist 47, and the hand base portion 49 around the corresponding axes, the manipulator 4 further includes servomotors 61 to 64 and a power transmission mechanism (not shown). As driving portions configured to make the lifting shaft 41 expand and contract from the base 40, the manipulator 4 includes a servomotor 65 and a power transmission mechanism (not shown). The servomotors 61 to 65 operate based on control signals output from the controller 6.

Substrate Holding Hand 5A

Figure 4:
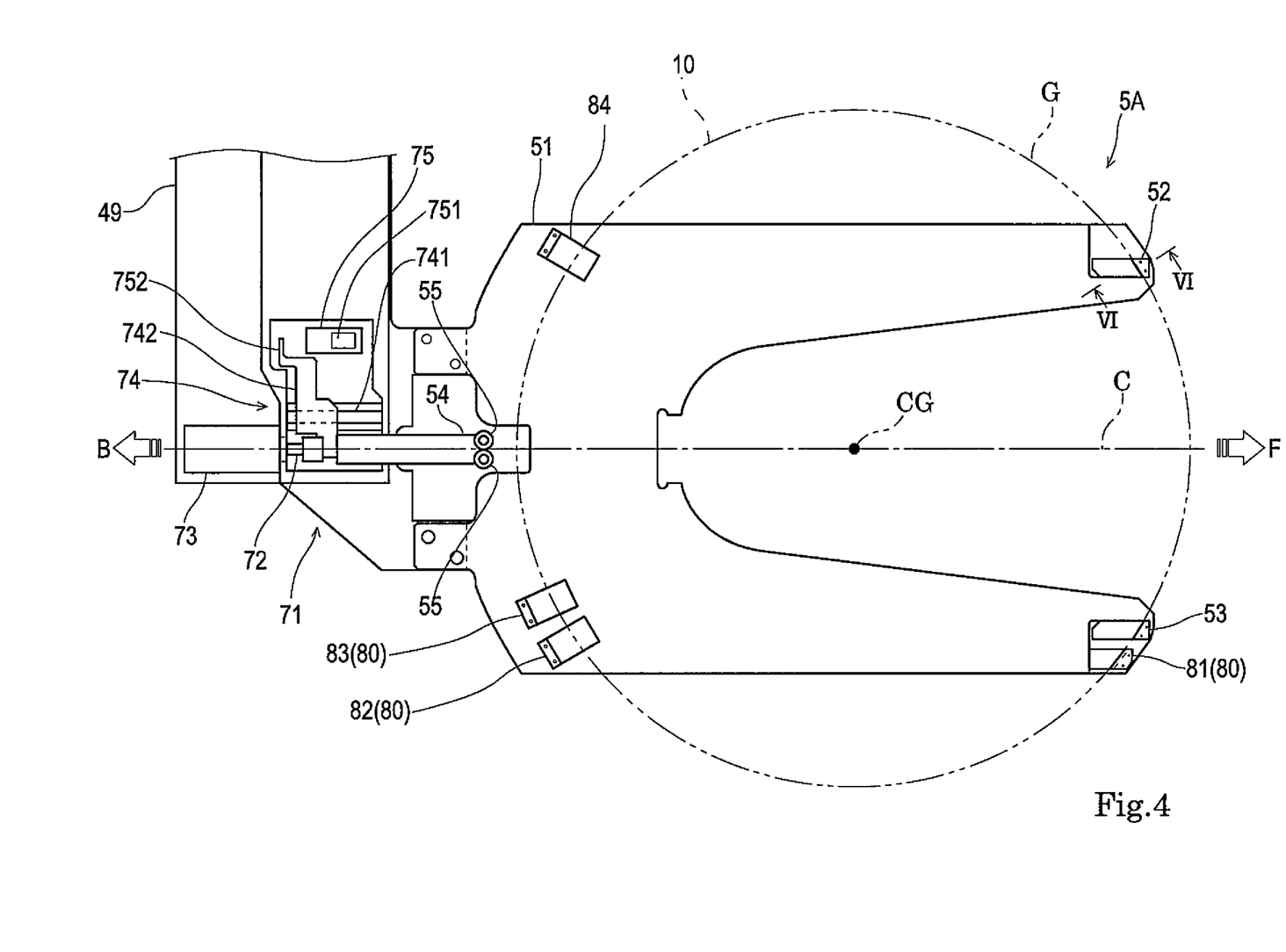
FIG. 4 is a schematic plan view of a substrate holding hand.
Figure 5:
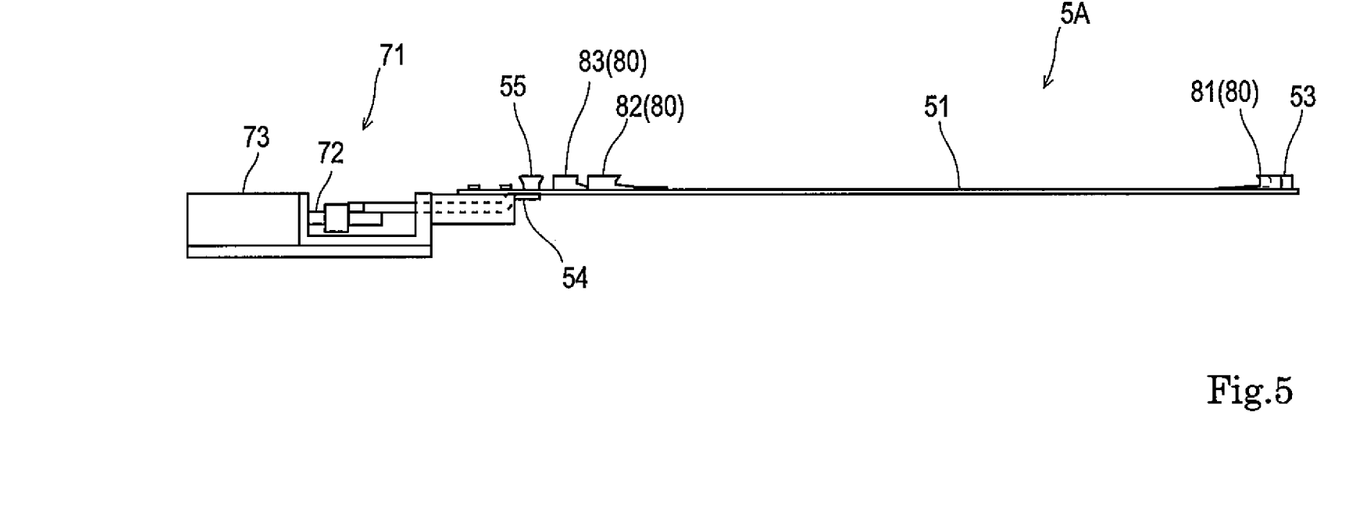
FIG. 5 is a schematic side view of the substrate holding hand.

FIG. 4 is a schematic plan view of the substrate holding hand 5A, and FIG. 5 is a schematic side view of the substrate holding hand 5A.

As shown in FIGS. 4 and 5, the substrate holding hand 5A includes a base plate 51 as a base. The base plate 51 spreads from a base end side B toward a tip end side F, and part of the base plate 51 which part is located at the base end side B is fixed to the hand tip portion of the manipulator 4. A virtual center line C connecting the base end side B and the tip end side F in the substrate holding hand 5A is defined at the base plate 51. The substrate holding hand 5A has a shape that is substantially symmetrical with respect to the center line C as an axis of symmetry. It should be noted that the base plate 51 does not have to have the shape that is symmetrical with respect to the center line C. Further, a virtual holding position G set such that the center of the substrate 10 is located on the center line C is defined at the base plate 51. The center of the holding position G is referred to as a holding center CG The center of the substrate 10 located at the holding position G coincides with the holding center CG It should be noted that the center line C and the holding position G may be defined at the substrate holding hand 5A.

The substrate holding hand 5A further includes two engaging claws 52 and 53, a moving portion 54, and an actuator 71. The engaging claws 52 and 53 are provided at the base plate 51. The moving portion 54 is located at the base end side B of the holding position G and reciprocates toward the tip end side F. The actuator 71 makes the moving portion 54 reciprocate. The operation of the actuator 71 is controlled by the controller 6.

The base plate 51 has a thin, flat spatula shape and also has a substantially Y shape (U shape) as a whole by largely cutting out a tip end portion thereof passing through the center line C. A base end of the base plate 51 is fixed to the hand base portion 49 by a fastening member.

The engaging claws 52 and 53 are arranged at the tip end side F of the holding center CG of the base plate 51 so as to be able to be engaged with the edge of the substrate 10 located at the holding position G The engaging claws 52 and 53 according to the present embodiment are provided at the tip end side F of the holding center CG of the base plate 51 so as to be located at both respective sides of the center line C.

When the substrate holding hand 5A holds the substrate 10 placed in the vertical posture, the engaging claw 52 out of the engaging claws 52 and 53 is engaged with part of the edge of the substrate 10 in the vertical posture which part is located higher than the center of the substrate 10, and the engaging claw 53 is engaged with part of the edge of the substrate 10 in the vertical posture which part is located higher than the center of the substrate 10. Hereinafter, the engaging claw 52 is referred to as an "upper engaging claw 52," and the engaging claw 53 is referred to as a "lower engaging claw 53." Further, for convenience of explanation, a direction from the center line C of the substrate holding hand 5A toward the upper engaging claw 52 is defined as an "upper direction," and a direction from the center line C of the substrate holding hand 5A toward the lower engaging claw 53 is defined as a "lower direction."

Figure 6:
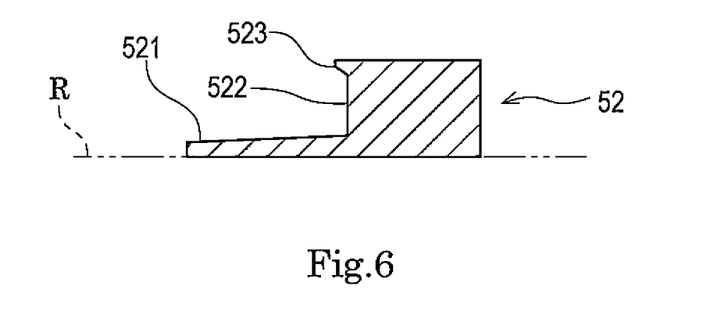
FIG. 6 is a sectional view taken along line VI-VI of FIG. 4.

FIG. 6 is a sectional view taken along line VI-VI of FIG. 4 and showing a sectional shape of the upper engaging claw 52. Since the upper engaging claw 52 and the lower engaging claw 53 have substantially corresponding structural features, the upper engaging claw 52 will be described below, and an explanation of the lower engaging claw 53 is omitted. As shown in FIG. 6, a pad surface 521, a groove portion 522, and a claw portion 523 are integrally formed at the upper engaging claw 52. The pad surface 521 is inclined so as to approach a surface R of the base plate 51 toward the holding center CG The groove portion 522 is open toward the holding center CG in parallel with the surface R of the base plate 51. The claw portion 523 extends along an edge of the groove portion 522. The edge of the substrate 10 located at the holding position G is fitted in the groove portion 522. The edge of the substrate 10 fitted in the groove portion 522 is locked by the claw portion 523 such that the substrate 10 is prevented from falling from the groove portion 522.

In the present description and the claims, a state where the edge of the substrate 10 is in contact with the groove portion 522 of the upper engaging claw 52 (or the lower engaging claw 53) is defined as "a state where the substrate 10 is engaged with the upper engaging claw 52 (or the lower engaging claw 53)," and a contact portion where the edge of the substrate 10 and the groove portion 522 of the upper engaging claw 52 (or the lower engaging claw 53) contact each other is defined as "an engaging portion where the substrate 10 and the upper engaging claw 52 (or the lower engaging claw 53) are engaged with each other."

The moving portion 54 is driven by the actuator 71 to reciprocate on an extended line of the center line C at the base end side B of the holding position G In the present embodiment, the moving portion 54 is a plate-shaped body extending along the center line C and parallel to the base plate 51.

Figure 7:
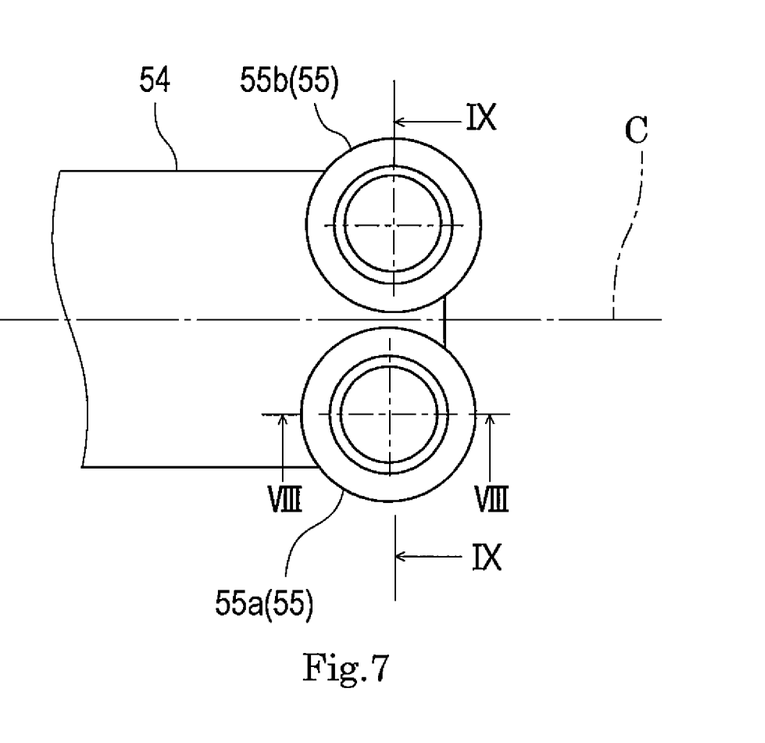
FIG. 7 is an enlarged plan view showing part of the substrate holding hand shown in FIG. 4.

FIG. 7 is an enlarged plan view of a tip end side part of the moving portion 54 shown in FIG. 4. At least one rotating body 55 configured to be rotatable around an axis vertical to the base plate 51 is provided at part of the moving portion 54 which part is located at the tip end side F. By moving the moving portion 54 forward toward the tip end side F, the rotating body 55 can act on part of the edge of the substrate 10 which part is located at the base end side B. As described below, the rotating body 55 acts on the edge of the substrate 10, and with this, holds the substrate 10 in cooperation with the upper engaging claw 52 and the lower engaging claw 53. As shown in FIG. 7, in the present embodiment, two rotating bodies 55 are arranged at the part of the moving portion 54 which part is located at the tip end side F, and are lined up in a direction perpendicular to the center line C.

Figure 8:
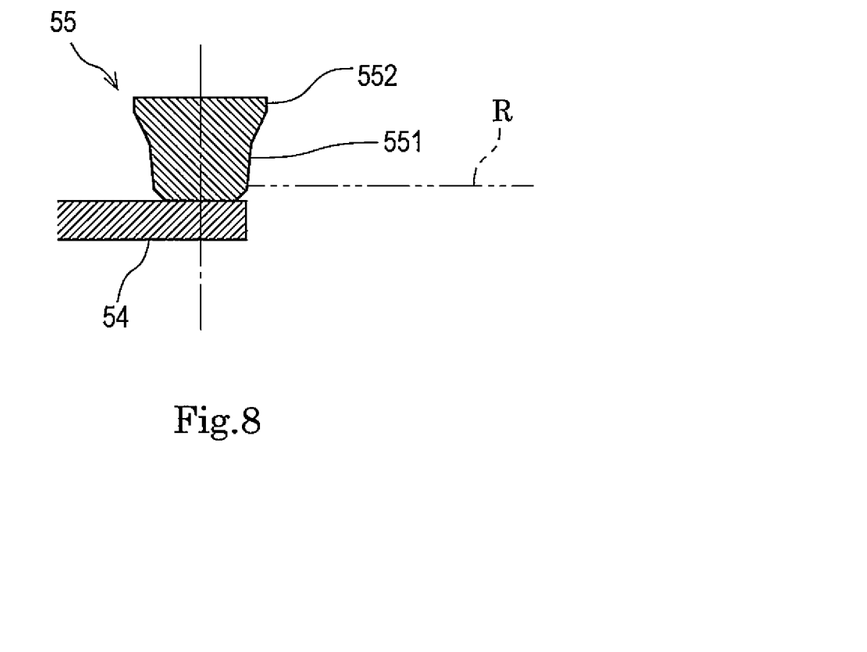
FIG. 8 is a sectional view taken along line VIII-VIII of FIG. 7.
Figure 9:
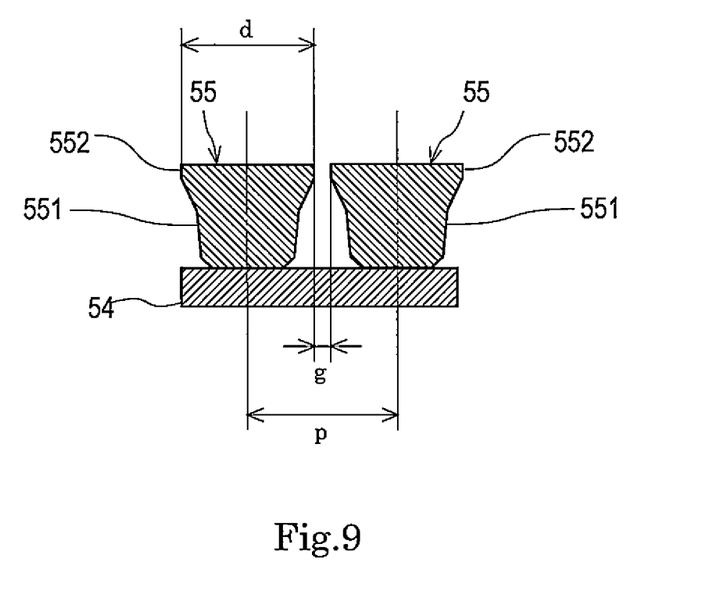
FIG. 9 is a sectional view taken along line IX-IX of FIG. 7.

FIG. 8 is a sectional view taken along line VIII-VIII of FIG. 7, and FIG. 9 is a sectional view taken along line IX-IX of FIG. 7. As shown in FIG. 8, the rotating body 55 includes an acting portion 551 and a claw portion 552 provided at an edge of the acting portion 551. The acting portion 551 may be an oblique surface inclined so as to be opposed to an extended surface of the surface R of the base plate 51. It should be noted that the acting portion 551 may be a surface perpendicular to the surface R of the base plate 51. When the rotating body 55 is moved toward the tip end side F, the acting portion 551 can act on the edge of the substrate 10 located at the holding position G While the acting portion 551 is acting on the edge of the substrate 10, the substrate 10 is locked by the claw portion 552 so as not to fall from the acting portion 551.

Figure 11A:
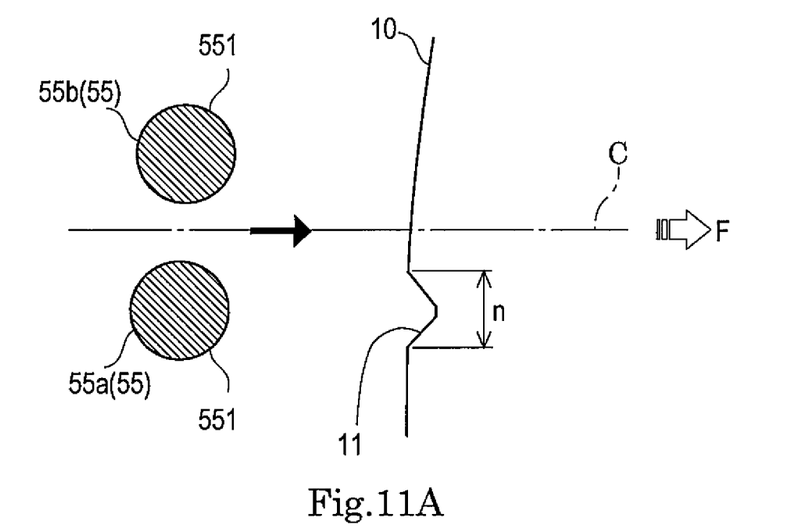
FIG. 11A is a diagram schematically showing a state immediately before a rotating body contacts the substrate.
Figure 11B:
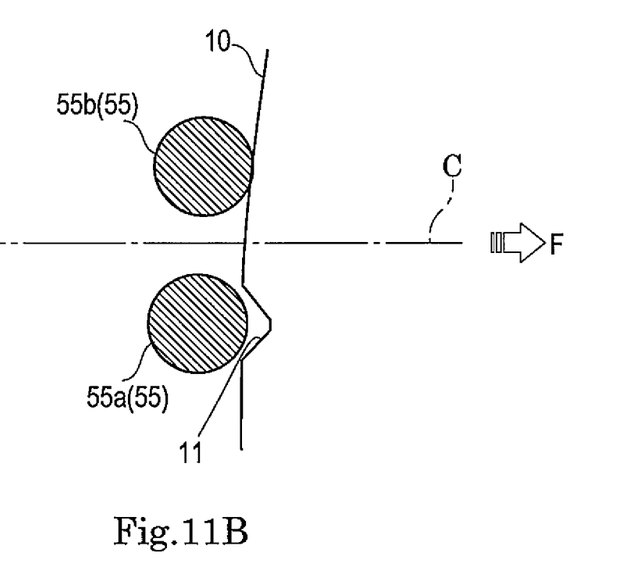
FIG. 11B is a diagram schematically showing a state immediately after the rotating body contacts the substrate.

In the present embodiment, a diameter d of the rotating body 55 is, for example, 40 mm or less and is longer than at least a width n (see FIG. 11) of the notch 11 of the substrate 10. As shown in FIG. 9, the two rotating bodies 55 are arranged close to each other. Specifically, a distance g of a gap between the two rotating bodies 55 is 10 mm or less. Preferably, the distance g of the gap between the two rotating bodies 55 is shorter than the width n of the notch 11 of the substrate 10. A distance p between the centers of the two rotating bodies 55 is larger than the width n of the notch 11 and smaller than three times the width n of the notch 11.

The two rotating bodies 55 are arranged at the moving portion 54 such that when the two rotating bodies 55 contact the substrate 10, each of the two rotating bodies 55 is not fitted in the notch 11, i.e., at least one of the two rotating bodies 55 surely contacts part of the edge of the substrate 10 other than the notch 11. Details will be described later.

In the present embodiment, the actuator 71 configured to drive the moving portion 54 is an air cylinder supported by the hand base portion 49. However, the actuator 71 is not limited to the air cylinder. For example, the actuator 71 may be one selected from the group consisting of a power transmission mechanism (such as a combination of an electric motor and a rack and pinion or a combination of an electric motor and a ball screw), a pneumatic cylinder, a hydraulic cylinder, and the like. The operation of the actuator 71 is controlled by the controller 6.

As shown in FIG. 4, the actuator 71 includes a rod 72 and a sleeve 73 at which the rod 72 advances and retreats. The sleeve 73 is fixed to the hand base portion 49 such that an extending direction of the rod 72 is parallel to the center line C, and the rod 72 is arranged on an extended line of the center line C. With this, the rod 72 and the moving portion 54 are lined up on the center line C and its extended line, and pressing force transmitted from the rod 72 through the moving portion 54 to the substrate 10 can be generated toward the center of the substrate 10.

The moving portion 54 reciprocates in parallel with the center line C by the expansion and contraction of the rod 72 by the actuator 71. When the rod 72 contracts, the moving portion 54 is located at an evacuation position. When the rod 72 expands, the moving portion 54 is moved forward and soon reaches an action position. Then, when the rod 72 contacts, the moving portion 54 is moved backward and soon returns to the evacuation position.

The track of the expansion and contraction of the rod 72 is guided by a guide 74. The guide 74 is constituted by: a rail member 741 fixed to the hand base portion 49; and a slider member 742 fixed to the rod 72. When the slider member 742 slides on the rail member 741, the rod 72 is guided so as to expand and contract in parallel with the center line C. The track of the rod 72 is guided as above, and as a result, the shaking of the track of the reciprocating movement of the moving portion 54 coupled to the rod 72 is suppressed.

The position of the moving portion 54 that reciprocates as above is detected by a position sensor 75. In the present embodiment, a detecting portion 751 of the position sensor 75 is fixed to the hand base portion 49, and a detected portion 752 of the position sensor 75 is provided integrally with the slider member 742. The detecting portion 751 is a contact-type or noncontact-type object detector and detects the position of the moving portion 54 by detecting the position of the detected portion 752. A detection signal of the position sensor 75 is output to the controller 6.

At least one support claw 80 is provided at the base plate 51. The support claw 80 supports, from below, the substrate 10 placed in the vertical posture and located lower than the holding position G and at the base end side B. For example, the support claw 80 temporarily supports the substrate 10 before the moving portion 54 is moved, or the support claw 80 prevents the substrate 10 from falling from the substrate holding hand 5.

In the present embodiment, as the support claw 80, a first support claw 81 is provided under the holding center CG of the base plate 51 and at the tip end side F, and a second support claw 82 and a third support claw 83 are provided under the holding center CG of the base plate 51 and at the base end side B. The first support claw 81 is provided right under the lower engaging claw 53. The first support claw 81, the second support claw 82, and the third support claw 83 are arranged so as to support, from below, the substrate 10 placed in the vertical posture and located lower than the holding position G and at the base end side B.

It should be noted that the number of support claws 80 and the positions of the support claws 80 are not limited to the present embodiment. In the present embodiment, the first support claw 81 is provided separately from the lower engaging claw 53. However, the first support claw 81 may be provided integrally with the lower engaging claw 53. Or, the first support claw 81 may not be provided at the base plate 51, and the lower engaging claw 53 may have the function of the support claw 80.

Further, at least one retaining claw 84 is provided at the base plate 51. If the substrate 10 is moved upward beyond the holding position the retaining claw 84 contacts an upper part of the edge of the substrate 10 to prevent the substrate 10 from moving upward. In the present embodiment, the retaining claw 84 is arranged above the holding center CG of the base plate 51 and at the base end side B.

Each of the support claws 80 and the retaining claws 84 has structural features substantially corresponding to those of the upper engaging claw 52 and the lower engaging claw 53 and includes a pad surface, a groove portion, and a claw portion.

Operations of Substrate Conveying Apparatus 3

Figure 10:
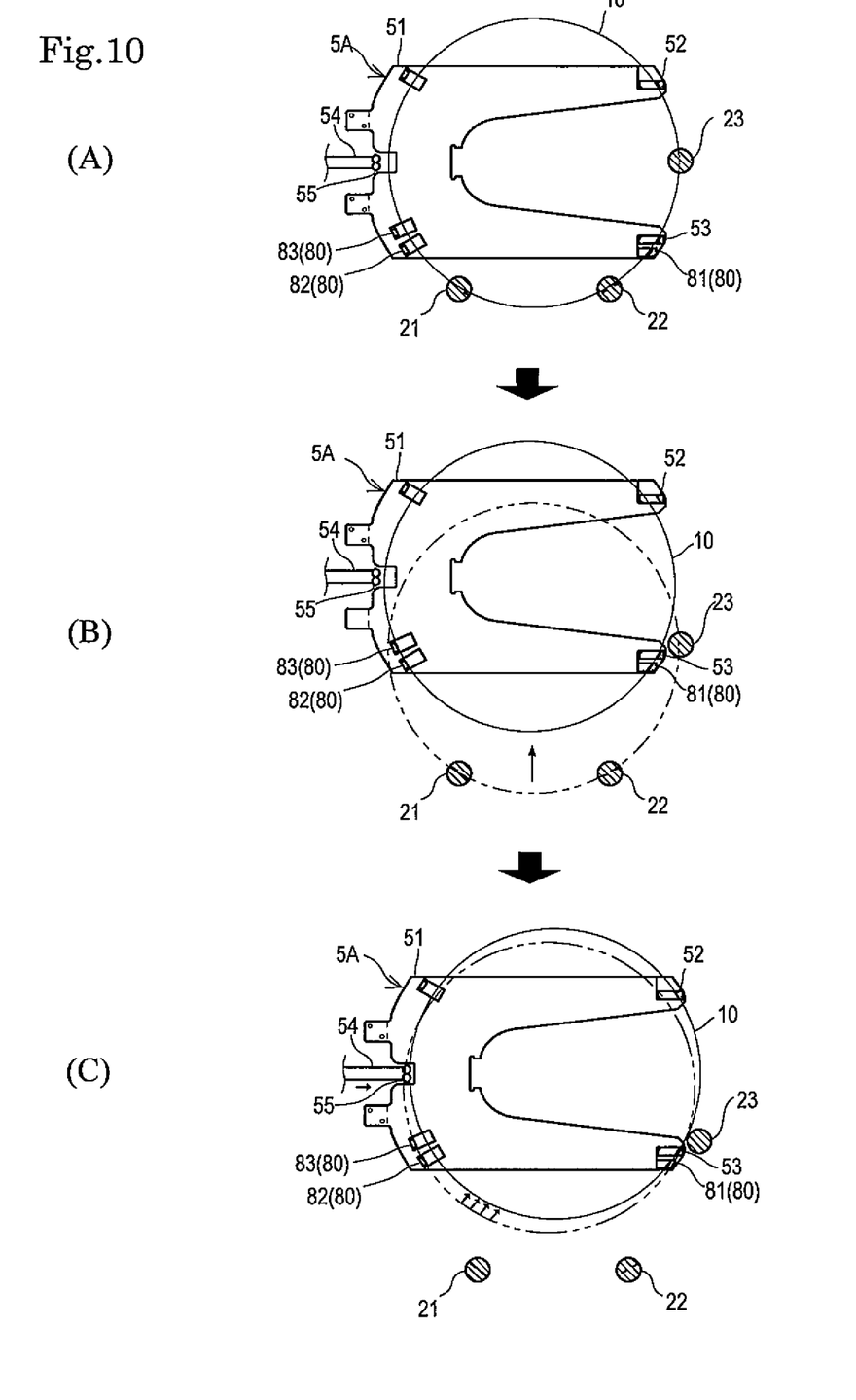
FIGS. 10A to 10C are diagrams for explaining operations of a substrate conveying apparatus configured to hold a substrate placed in a vertical posture.

Next, the operations of the substrate conveying apparatus 3 when taking out the substrate 10 accommodated in the substrate vertically placing container 2 in the vertical posture will be described with reference to FIG. 10. In the following, although not especially described, the operations of the manipulator 4 and the substrate holding hand 5A are controlled by the controller 6.

First, the manipulator 4 operates, and with this, the substrate holding hand 5A in the vertical posture is moved to a take-out start position corresponding to the substrate 10 placed in the substrate vertically placing container 2 in the vertical posture. FIG. 10A shows a positional relation between the substrate 10 and the substrate holding hand 5A located at the take-out start position corresponding to the substrate 10 placed in the vertical posture. As shown in FIG. 10A, at the take-out start position, the substrate holding hand 5A takes such a posture that the center line C coincides with the horizontal direction. It should be noted that this posture of the substrate holding hand 5A is kept in a period from when the substrate holding hand 5A has reached the take-out start position until when the substrate holding hand 5A holds the substrate 10. At the time when the substrate holding hand 5A has reached the take-out start position, the substrate holding hand 5A is not in contact with the substrate 10, and the substrate 10 is supported only by the substrate vertically placing container 2, more specifically, only by the three supporting members 21 to 23. Further, the moving portion 54 is located at the evacuation position.

Next, the manipulator 4 operates, and with this, the substrate holding hand 5A is moved slightly upward from the take-out start position such that the substrate 10 is supported by the support claws 80. FIG. 10B shows a state where the substrate holding hand 5A supports the substrate 10 in the vertical posture by the support claws 80. When the substrate 10 is located at such a position (support position) as to be supported by the support claws 80, the upper engaging claw 52 and the lower engaging claw 53 are not in contact with the edge of the substrate 10 and are located slightly away from and face the edge of the substrate 10. It should be noted that the lower engaging claw 53 may contact the edge of the substrate 10 located at the support position.

Then, the actuator 71 operates, and with this, the moving portion 54 is moved forward toward the tip end side F in parallel with the center line C. Thus, the rotating bodies 55 push the edge of the substrate 10 located at the support position, and therefore, the substrate 10 is moved from the support position to the holding position G.

FIG. 10C shows a state where the substrate 10 is pushed by the rotating bodies 55 to be moved to the holding position G As shown in FIG. 10C, the rotating bodies 55 act on the substrate 10, and with this, the force of rotating the substrate 10 upward about the engaging portion where the substrate 10 and the first support claw 81 located at the tip end side F are engaged with each other acts on the substrate 10. As a result, the substrate 10 located at the support position is pushed upward by being rotated about the engaging portion where the substrate 10 and the first support claw 81 are engaged with each other. At this time, the rotating bodies 55 contacting the peripheral edge of the substrate 10 also rotate so as to guide the movement of the substrate 10.

When the rotating bodies 55 push the substrate 10 upward while rotating, the substrate 10 separates from the second and third support claws 82 and 83 and is soon engaged with the lower engaging claw 53 and separates from the first support claw 81. After that, the rotating bodies 55 continuously act on the substrate 10, and the substrate 10 is pushed upward by being rotated about the contact portion (engaging portion) where the substrate 10 and the lower engaging claw 53 contact each other, and is soon reaches the holding position G at which the substrate 10 is stopped by the upper engaging claw 52. It should be noted that in a period until when the substrate 10 reaches the holding position the substrate 10 may rotate while rolling in the groove of the lower engaging claw 53, or the substrate 10 may rotate while sliding at the contact portion where the substrate 10 and the groove of the lower engaging claw 53 contact each other.

It should be noted that the operations of the substrate conveying apparatus 3 when taking out the substrate 10 placed in the vertical posture are not limited to the above-described operations. For example, in the above-described operations, after the substrate 10 is moved to the support position at which the substrate 10 is supported by the support claws 80, the operation of the actuator 71 is started. However, the present embodiment is not limited to this, and the operation of the actuator 71 may be started before the substrate 10 is moved to the support position.

For example, the operation of the actuator 71 may be started at the same time when the substrate holding hand 5A is moved upward from the take-out start position or before the substrate holding hand 5A is moved upward from the take-out start position. In this case, the substrate 10 may contact the rotating bodies 55 before contacting the support claws 80 and may be then supported by the rotating bodies 55 and the lower engaging claw 53.

If the rotating body 55 moving toward the substrate 10 is fitted in the notch 11 of the substrate 10, there is a possibility that the substrate 10 cannot be pushed upward toward the holding position or the substrate 10 is damaged by unnecessary stress acting on the substrate 10. Hereinafter, a case where the notch 11 is located in a direction in which the rotating bodies 55 are moved by the movement of the moving portion 54 will be described with reference to FIGS. 11A and 11B.

FIG. 11A is a diagram schematically showing a state immediately before the rotating body 55 moved by the movement of the moving portion 54 contacts the edge of the substrate 10. FIG. 11B is a diagram schematically showing a state immediately after the rotating body 55 moved by the movement of the moving portion 54 contacts the edge of the substrate 10. It should be noted that FIGS. 11A and 11B are sectional views taken along a portion where the rotating body 55 contacts the substrate 10.

In the illustrated example of FIG. 11A, the notch 11 is located in a direction in which the rotating body 55*a* out of the two rotating bodies 55*a* and 55*b* is moved by the movement of the moving portion 54. However, as shown in FIG. 11B, when the moving portion 54 is moved forward, the rotating body 55*b* first contacts the edge of the substrate 10, and therefore, the rotating body 55*a* is prevented from being fitted in the notch 11.

As above, in the present embodiment, the two rotating bodies 55*a* and 55*b* are arranged at the moving portion 54 such that at least one of the two rotating bodies 55*a* and 55*b* surely contacts part of the edge of the substrate 10 other than the notch 11. More specifically, the two rotating bodies 55*a* and 55*b* are arranged at the moving portion 54 such that even when the notch 11 is located in a direction in which the rotating body 55*a* is moved by the movement of the moving portion 54, the rotating body 55*b* first contacts part of the edge of the substrate 10 other than the notch 11. With this, the rotating body 55 is prevented from being fitted in the notch 11 of the substrate 10.

The two rotating bodies 55 are arranged close to each other. Therefore, while the substrate 10 is moving from the support position to the holding position, a distance between the edge of the substrate 10 and one of the two rotating bodies 55 and a distance between the edge of the substrate 10 and the other of the two rotating bodies 55 are not so different from each other. On this account, when one of the rotating bodies 55 is about to be fitted in the notch 11 while the substrate 10 is moving from the support position to the holding position, the other rotating body 55 contacts the edge of the substrate 10, so that the substrate 10 can move smoothly.

As described above, when the substrate holding hand 5A according to the present embodiment holds the substrate 10 having the circular plate shape and placed in the vertical posture, the rotating bodies 55 configured to push from the base end side B the substrate 10 located lower than the holding position G and contacting the first support claw 81 or the lower engaging claw 53 pushes the substrate 10 upward toward the holding position G while rotating along the edge of the substrate 10. Therefore, the frictional force generated at the the contact portion where the substrate holding hand 5A and the substrate 10 contact each other when the substrate 10 is moved to the holding position G can be reduced. With this, unnecessary stress can be prevented from being generated at the substrate 10.

The present invention is not limited to the above-described embodiment, and various modifications may be made within the scope of the present invention.

For example, the number of upper engaging claws 52, the number of lower engaging claws 53, and the positions of the upper engaging claw 52 and the lower engaging claw 53 are not limited to the above embodiment. Further, one engaging claw may be provided at part of the base plate 51 so as to extend across the center line C, the part being located at the tip end side F, and this engaging claw may have both the function of the upper engaging claw 52 and the function of the lower engaging claw 53. In each of the substrate holding hands 5A to 5C according to the above embodiments, a plurality of support claws 80 are provided. However, the number of support claws 80 may be one.

In the above embodiment, the lower engaging claw 53 and the first support claw 81 which are provided at the tip end side F of the holding center CG of the base plate 51 are members independent from each other. Instead of the lower engaging claw 53 and the first support claw 81, a single member having the functions of the claws 53 and 81 may be provided at the base plate 51.

In the above embodiment, the two rotating bodies 55 are provided. However, the number of rotating bodies 55 may be three or more.

In the above embodiment, the two rotating bodies 55 are arranged at the plate-shaped body, which is the moving portion 54 extending along the center line C, so as to be lined up in a direction perpendicular to the center line C. However, the shape of the moving portion 54 and the positions of a plurality of rotating bodies 55 are not limited to the above. For example, the moving portion 54 may have such a shape as to include a plurality of branches extending toward the tip end side F, and the rotating bodies 55 may be provided at the respective branches.

Figure 12:
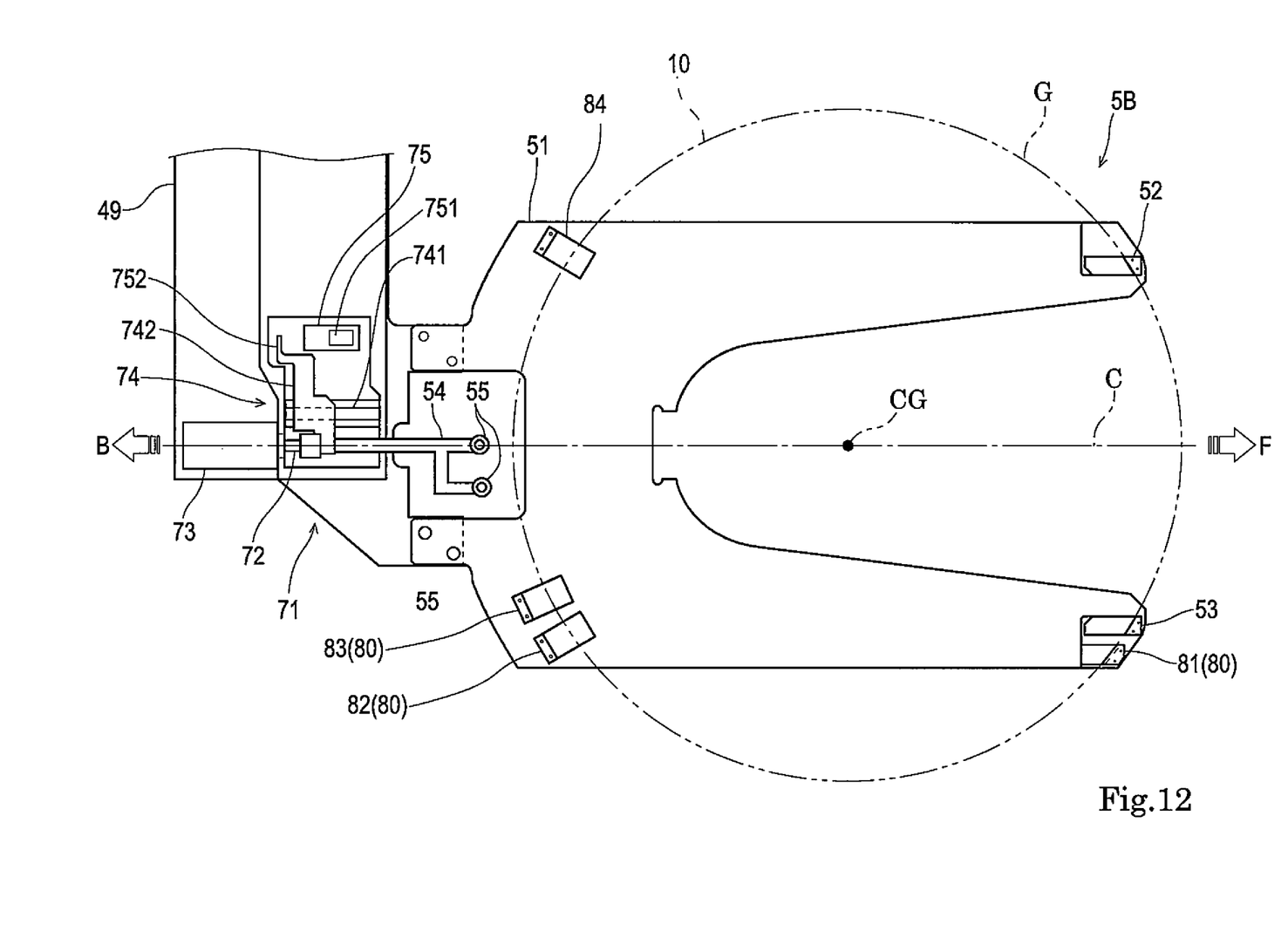
FIG. 12 is a schematic plan view of the substrate holding hand according to a modified example.
Figure 13:
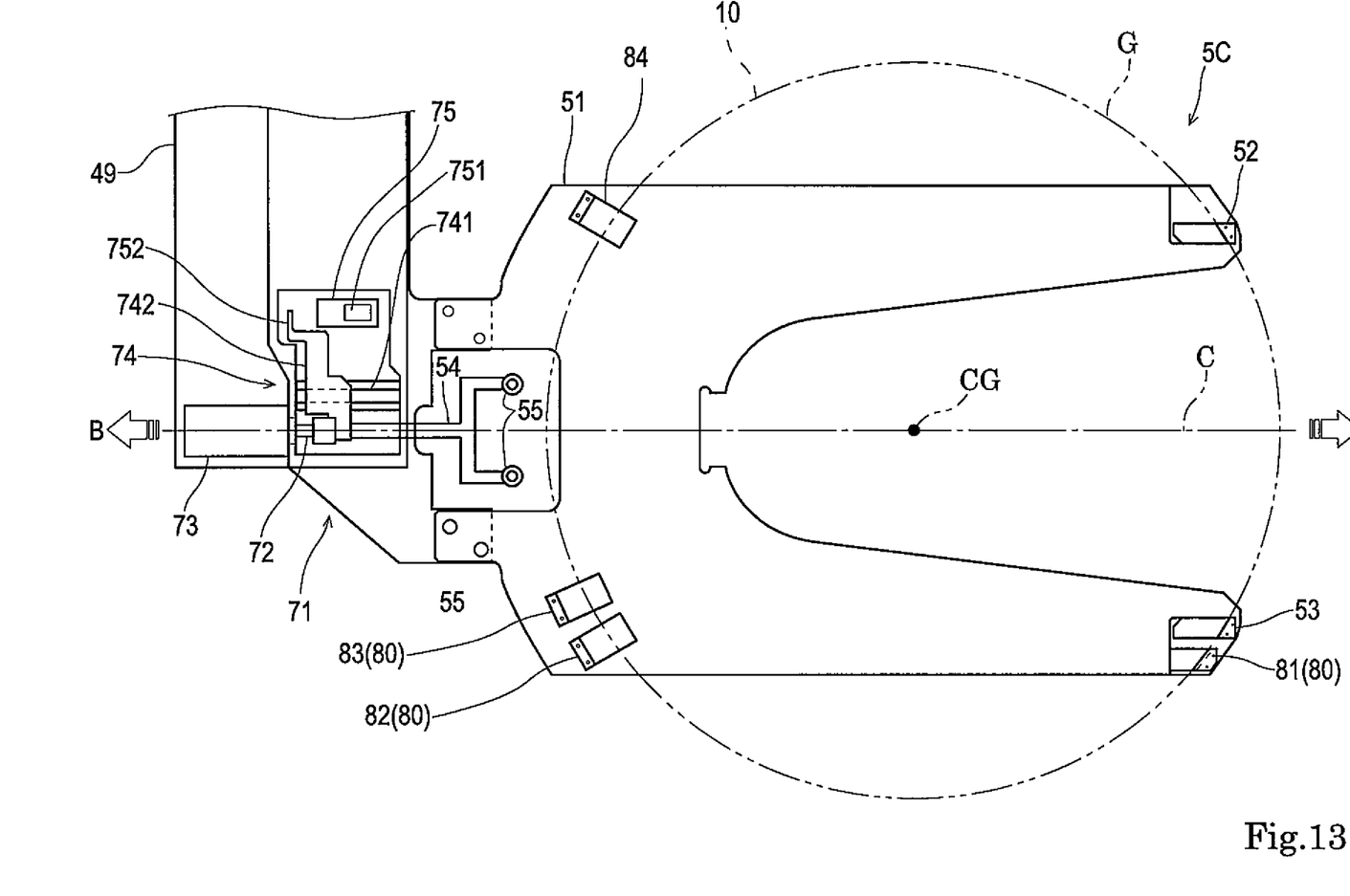
FIG. 13 is a schematic plan view of the substrate holding hand according to another modified example.

For example, as shown in FIG. 12, the moving portion 54 may have such a shape as to include a part extending along the center line C and a part branching downward from a portion of the part extending along the center line C, and one rotating body 55 may be provided at each of tip ends of the parts. For example, as shown in FIG. 13, the moving portion 54 may have such a shape as to include upper and lower branches extending toward the tip end side F from a tip end of a part extending along the center line C, and one rotating body 55 may be provided at each of tip ends of the upper and lower branches. In each of the substrate holding hands 5B and 5C shown in FIGS. 12 and 13, the two rotating bodies 55 may be arranged at the moving portion such that even if the notch 11 is located in a direction in which one of the rotating bodies 55 is moved by the movement of the moving portion 54, the other rotating body 55 first contacts part of the edge of the substrate 10 other than the notch 11.

In the above embodiment, the moving portion 54 reciprocates on the extended line of the center line C. However, the moving portion 54 may move on, for example, a straight line located lower than the holding center CG of the base plate 51 and parallel to the center line C or do not have to reciprocate in parallel with the center line C. Further, in the above embodiment, the substrate conveying apparatus 3 operates such that the substrate holding hand 5 holds the substrate 10 in such a posture that the center line C of the substrate holding hand 5 is in parallel with the horizontal direction. However, the posture of the substrate holding hand 5 when holding the substrate is not limited to this, and may be changed suitably.

REFERENCE SIGNS LIST 1 substrate conveying system
2 substrate conveying apparatus
3 substrate vertically placing container
4 manipulator
5A, 5B, 5C substrate holding hand
6 controller
10 substrate
11 notch
49 hand base portion
51 base plate
52 upper engaging claw
53 lower engaging claw
54 moving portion
55 rotating body
80 support claw
81 first support claw
82 second support claw
83 third support claw
B base end side
C center line
F tip end side
G holding position

The invention claimed is:

1. A substrate holding hand attached to a hand tip portion of a manipulator and configured to hold a substrate having a circular plate shape and placed in a vertical posture, the substrate holding hand comprising:
   a base plate spreading from a base end side toward a tip end side, part of the base plate which is located at the base end side being fixed to the hand tip portion;
   a lower engaging claw provided at part of the base plate which part is located at the tip end side, the lower engaging claw being configured to be engaged with part of an edge of the substrate in the vertical posture, the part of the edge being located lower than a center of the substrate;
   an upper engaging claw separated from the lower engaging claw and provided at part of the base plate which part is located at the tip end side, the upper engaging claw being configured to be engaged with part of the edge of the substrate in the vertical posture, the part of the edge being located higher than the center of the substrate;
   an actuator;
   a moving portion provided at the base end side of a holding position and configured to be driven by the actuator to linearly move toward the tip end side, the holding position being a position of the substrate relative to the base plate when the substrate is held by the substrate holding hand;
   a plurality of rotating bodies provided at part of the moving portion which part is located at the tip end side, the plurality of rotating bodies holding the substrate in cooperation with the upper engaging claw and the lower engaging claw in such a manner that (i) the plurality of rotating bodies are pressed by the movement of the moving portion against the edge of the substrate which is located lower than the holding position, is engaged with the lower engaging claw, but is not engaged with the upper engaging claw, and with this, (ii) while rotating along the edge of the substrate, the plurality of rotating bodies rotate the substrate about an engaging portion where the substrate is engaged with the lower engaging portion, and push the substrate upward toward the holding position where the substrate is engaged with the upper engaging claw; and at least one support claw that is fixed to the base plate at a position lower than the holding position and located at the base end side and supports together with the lower engaging claw the substrate in the vertical posture before the moving portion moves toward the tip end side, the at least one support claw being positioned such that the substrate in the vertical posture separates from the at least one support claw when the substrate is pushed upward toward the holding position by the movement of the moving portion, wherein:

the support claw is located farther from the center of the substrate at the holding position than the rotating bodies in a direction that is perpendicular to a driving direction of the actuator and parallel to the substrate in the vertical posture;

the support claw is located at the base end side of the holding position;

the lower engaging claw is located at the tip end side of the holding position;

the support claw and the lower engaging claw are on a same horizontal plane when the substrate is in the vertical posture; and the support claw and the lower engaging claw are opposed to each other in the driving direction of the actuator across the center of the substrate at the holding position.

2. The substrate holding hand according to claim 1, wherein:

a notch is formed at the edge of the substrate; and the plurality of rotating bodies are arranged at the moving portion such that even if the notch is located in a direction in which one of the plurality of rotating bodies is moved by the movement of the moving portion, the other rotating body first contacts part of the edge of the substrate other than the notch.

3. A substrate conveying apparatus comprising:

the substrate holding hand according to claim 1; and a manipulator including a hand tip portion to which the substrate holding hand is attached.

4. A substrate conveying apparatus comprising:

the substrate holding hand according to claim 2; and a manipulator including a hand tip portion to which the substrate holding hand is attached.

* * * * *